(12) United States Patent
Yamada et al.

(10) Patent No.: US 6,393,604 B1
(45) Date of Patent: May 21, 2002

(54) PROCESS FOR PREPARING DATA FOR DIRECT-WRITING BY A CHARGED PARTICLE RAY, PROCESS FOR VERIFYING DATA FOR DIRECT-WRITING BY A CHARGED PARTICLE RAY, PROCESS FOR DISPLAYING DATA FOR DIRECT-WRITING BY A CHARGED PARTICLE RAY, AND EXPOSURE DEVICE

(75) Inventors: Yasuhisa Yamada, Tokyo; Yuzo Ogawa, Kanagawa, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/435,630

(22) Filed: Nov. 8, 1999

(30) Foreign Application Priority Data

Nov. 9, 1998 (JP) .......................................... 10-318212

(51) Int. Cl.$^7$ ........................ G06G 17/50; G06G 19/00; G03F 9/00; H01L 21/027
(52) U.S. Cl. ........................... 716/21; 716/20; 700/121; 700/120; 700/109; 382/144; 378/35; 430/5
(58) Field of Search ................ 716/1–21; 700/120–121, 700/96, 108–110; 382/144; 378/34–35; 430/4–5

(56) References Cited

U.S. PATENT DOCUMENTS

| | | | | |
|---|---|---|---|---|
| 4,789,945 A | * | 12/1988 | Niijima ........................ | 716/21 |
| 5,210,696 A | * | 5/1993 | Yano ........................... | 716/21 |
| 5,375,157 A | * | 12/1994 | Maehara ...................... | 378/35 |
| 5,481,624 A | * | 1/1996 | Kamon ........................ | 382/144 |
| 5,776,645 A | * | 7/1998 | Barr et al. .................... | 430/22 |
| 5,795,688 A | * | 8/1998 | Burdorf et al. ............... | 430/30 |
| 5,801,954 A | * | 9/1998 | Le et al. ....................... | 716/21 |
| 6,069,971 A | * | 5/2000 | Kanno et al. ................ | 382/144 |
| 6,078,738 A | * | 6/2000 | Garza et al. ................. | 716/21 |
| 6,144,760 A | * | 11/2000 | Ohnuma ..................... | 382/144 |
| 6,145,118 A | * | 11/2000 | Tomita ........................ | 716/21 |
| 6,261,728 B1 | * | 7/2001 | Lin .............................. | 430/30 |

FOREIGN PATENT DOCUMENTS

| | | | | |
|---|---|---|---|---|
| JP | 04-219920 | 8/1992 | ......... | H01L/21/027 |
| JP | 05-036594 | 2/1993 | ......... | H01L/21/027 |
| JP | 05-182899 | 7/1993 | ......... | H01L/21/027 |
| JP | 6-5500 | 1/1994 | ......... | H01L/21/027 |
| JP | 07-130596 | 5/1995 | ......... | H01L/21/027 |
| JP | 07288224 A | * | 10/1995 | |

OTHER PUBLICATIONS

Harafuji et al. ("A novel hierarchical approach for proximity effect correction in electron beam lithography", IEEE Transactions on Computer–Aided Design of Integrated Circuits and Systems, vol. 12, No. 10, pp. 1508–1514, Oct. 1993).*

Okubu et al. ("A novel geometric resizing technique for data conversion CAD data to electron beam exposure data", IEEE Transactions on Computer–Aided Design of Integrated Circuits and Systems, vol. 11, No. 9, pp. 1104–1113, Sep. 1992).*

Japanese Office Action dated Jan. 23, 2001 with partial English translation.

* cited by examiner

Primary Examiner—Matthew Smith
Assistant Examiner—Phallaka Kik
(74) Attorney, Agent, or Firm—McGinn & Gibb, PLLC

(57) ABSTRACT

Plural patterns of cell projections made in an aperture are stored in a register. Cells in designed data are compared with the cell projections stored in the register by an interlayer operation, to judge whether or not a cell which coincides with any one of the cells in the designed data is present among the patterns of the cell projections stored in the register. In the case that the judgement that the coinciding cell is present is given, the coinciding cell projection is e acted and outputted as data for direct-writing. In the case that the judgement that no coinciding cell is present is given, if a cell whose reference frequency is over a given value is present, this cell is extracted and registered as a new cell projection.

13 Claims, 8 Drawing Sheets

FIG. 1
(PRIOR ART)

TABLE

| CELL NAME | APERTURE NUMBER | DOSE RANK |
|---|---|---|
| a | 1 | 1 |
| b | 2 | 21 |
| ... | ... | ... |
| ... | ... | ... |

PROCESS FOR PREPARING DATA FOR DIRECT-WRITING BY A CHARGED PARTICLE RAY, PROCESS FOR VERIFYING DATA FOR DIRECT-WRITING BY A CHARGED PARTICLE RAY, PROCESS FOR DISPLAYING DATA FOR DIRECT-WRITING BY A CHARGED PARTICLE RAY, AND EXPOSURE DEVICE

BACKGROUND OF THE INVENTION

1. Field of the Invention

The present invention relates to processes of using an aperture data base system to prepare, inspect and display data for direct-writing by a charged particle ray, including a cell projection pattern; and an exposure system making these processes possible.

2. Related Art

In the process for producing a semiconductor integrated circuit device, there is made practicable a finely-working technique for rendering an integrated circuit pattern, using a focused beam of a charged particle ray, such as an electron beam or an ion beam. For example, in an electron beam exposure device, an electron beam is radiated onto a wafer to which an electron beam sensitive resist is applied, so as to expose the wafer directly to the beam scanned in the form of an integrated circuit pattern. Thus, the integrated circuit pattern is directly formed. In order to obtain a drawn pattern by the electron beam (EB), an EB mask is used (Japanese Patent Application Laid-Open No. Hei 6-5500). This EB mask has a rectangle aperture and a cell projection aperture. The rectangle aperture is used for focusing the electron beam into a rectangle form, together with rectangle apertures that other EB masks have, and radiating the beam in a rectangle pattern whose size is variously changed onto the wafer. The cell projection aperture is an aperture for a partial pattern resulting from taking out a part of a direct-writing pattern that should be radiated onto the wafer. The cell projection aperture is used for radiating the beam having this partial pattern in a lump on the wafer. A plurality of the cell projection apertures are made in the mask and they are selectively used on the basis of designed data.

In a process for controlling exposure to light in a conventional electron beam exposure device, a table 1 as shown in FIG. 1 is prepared. The table 1 shows a correlative relationship about data including cell names of cell projections, which show aperture patterns of cell projection apertures; aperture numbers, which show respective positions, in the mask, where the respective cell projections are formed; and dose ranks, which show radiated amounts. As shown in FIG. 2, an operator judges whether or not designed data include a cell projection pattern (step S1). In the case that the designed data include no cell projection pattern, the designed data are subjected to processings such as removal of overlapping and format-conversion (step S2) to prepare variable shaping data for using a variable shaping aperture. The data are output as EB data.

On the other hand, in the case that the designed data include a cell projection pattern, a cell about which the number of reference is large is searched on the basis of the cell structure of the designed data. The resultant cell is extracted and specified as a cell projection pattern (step S3). Layout data, mask-bias values, and the like are added to the extracted cell projection pattern to obtain data for preparing an aperture (step S4). In the case that the designed data are converted to the EB data, cell projection data such as cell names, mask aperture numbers and dose ranks are designated in the form of, e.g., a table by hand-input, so as to specify a cell projection pattern (step S5). On the basis of these cell projection data, a flag of cell projection is raised for the pattern. The address of the cell projection pattern is designated by hand-input (step S6). The cell projection pattern is outputted as data for direct-writing in a cell projection (EB data) (step S7).

However, the above-mentioned process for preparing EB data in the prior art has the following drawbacks. Parameters for direct-writing in a cell projection need to be artificially inputted, and the aperture data are not linked with the table supplied at the time of the data conversion. Therefore, at the time of processing the data conversion, artificial mistakes may be made. Besides, much time is required for the data conversion.

The outputted EB data per se need to have information on the shape of a cell projection pattern. Thus, there is a problem that a volume in the data increases.

SUMMARY OF THE INVENTION

It is an object of the present invention to provide a process for preparing data for direct-writing by a charged particle beam, a process for verifying data for direct-writing by a charged particle beam, a process for displaying data for direct-writing by a charged particle beam, and a light exposure device which make it possible to prevent input-mistakes, perform data conversion into EB data quickly, and reduce a volume in the EB data.

The process for preparing data for direct-writing by a charged particle beam according to the present invention comprises the steps of:

storing plural patterns of cell projections made in an aperture in a register, and comparing cells in designed data with the cell projections stored in the register by an interlayer operation, judging whether or not a cell which coincides with any one of the cells in the designed data is present among the patterns of the cell projections stored in the register from the results of the interlayer operation, extracting, in the case that the judgement that the coinciding cell is present is given in the judging step, the coinciding cell projection, and outputting the extracted cell projection as data for direct-writing.

This process for preparing data for direct-writing by a charged particle beam preferably comprises, in the case that the judgement that no coinciding cell is present is given, second judging, when referring the cells in the designed data to the cell projections stored in the register, whether or not a cell whose reference frequency is over a given value is present in the designed data, second extracting, in the case that the cell whose reference frequency is over the given value is present in the designed data, this cell, and registering this cell as a new cell projection.

After the extracting step and the second extracting step, this process preferably comprises the designating step of reading out cell projection pattern information, which include an aperture number and an aperture area, from the register, and designating the data.

This process preferably comprises the mask data outputting step of outputting data for preparing a mask having the pattern of the cell projection stored in the register.

The process for verifying data for direct-writing by a charged particle beam according to the present invention comprises the steps of:

storing plural patterns of cell projections made in an aperture in a register, and judging whether or not writing data include a cell projection pattern, first format-inverting the writing data to obtain format data, in the case that the writing data include no cell projection pattern, second format-inverting alternative data so as to obtain format data after outputting a call for obtaining cell projection information to the register so as to obtain cell projection pattern alternative data from the register, in the case that the writing data include the cell projection pattern, comparing these format data resulting from the format-inversion with designed data by an interlayer operation.

The process for displaying data for direct-writing by a charged particle beam according to the present invention comprises the steps of:

storing plural patterns of cell projections made in an aperture in a register, and judging whether or not writing data include a cell projection pattern, first displaying the writing data as a pattern layout, in the case that the writing data include no cell projection pattern, second displaying an alternative data as a pattern layout by outputting a call for obtaining cell projection information to the register so as to obtain said alternative data of cell projection pattern from the register, in the case that the writing data include the cell projection pattern.

This process for displaying data for direct-writing by a charged particle beam preferably comprises inputting the call for obtaining the cell projection data so as to obtain a mask layout from the register, and displaying this mask layout.

The exposure device according to the present invention comprises a source for radiating a charged particle ray, a mask having a cell projection aperture, a unit for focusing the charged particle ray, a first deflector for deciding a position on the mask irradiated with the charged particle ray, a second deflector for deciding a position on a wafer irradiated with the charged particle ray, a controlling unit for controlling irradiation of the wafer with the charged particle ray and the cell projection aperture in connection with each other, and a register in which patterns of cell projections are stored. The controlling unit compares a cell projection of designed data with the cell projections in the register by an interlayer operation and then extracts, in the case that both of them coincide with each other, the coinciding cell projection from the register to use this coinciding cell projection, together with pattern information including an aperture position in the mask and an aperture area, as writing data.

In this exposure device, in the case that the cell projection of the designed data does not coincide with the cell projections stored in the register by the interlayer operation, the controlling unit extracts a cell projection about which the repetition reference frequency of the register is over a given number, and registers the cell projection newly into the register.

BRIEF DESCRIPTION OF THE DRAWINGS

FIG. 1 is a schematic view illustrating the content in a table artificially prepared in the prior art.

DESCRIPTION OF PREFERRED EMBODIMENTS OF THE INVENTION

Figure 2:
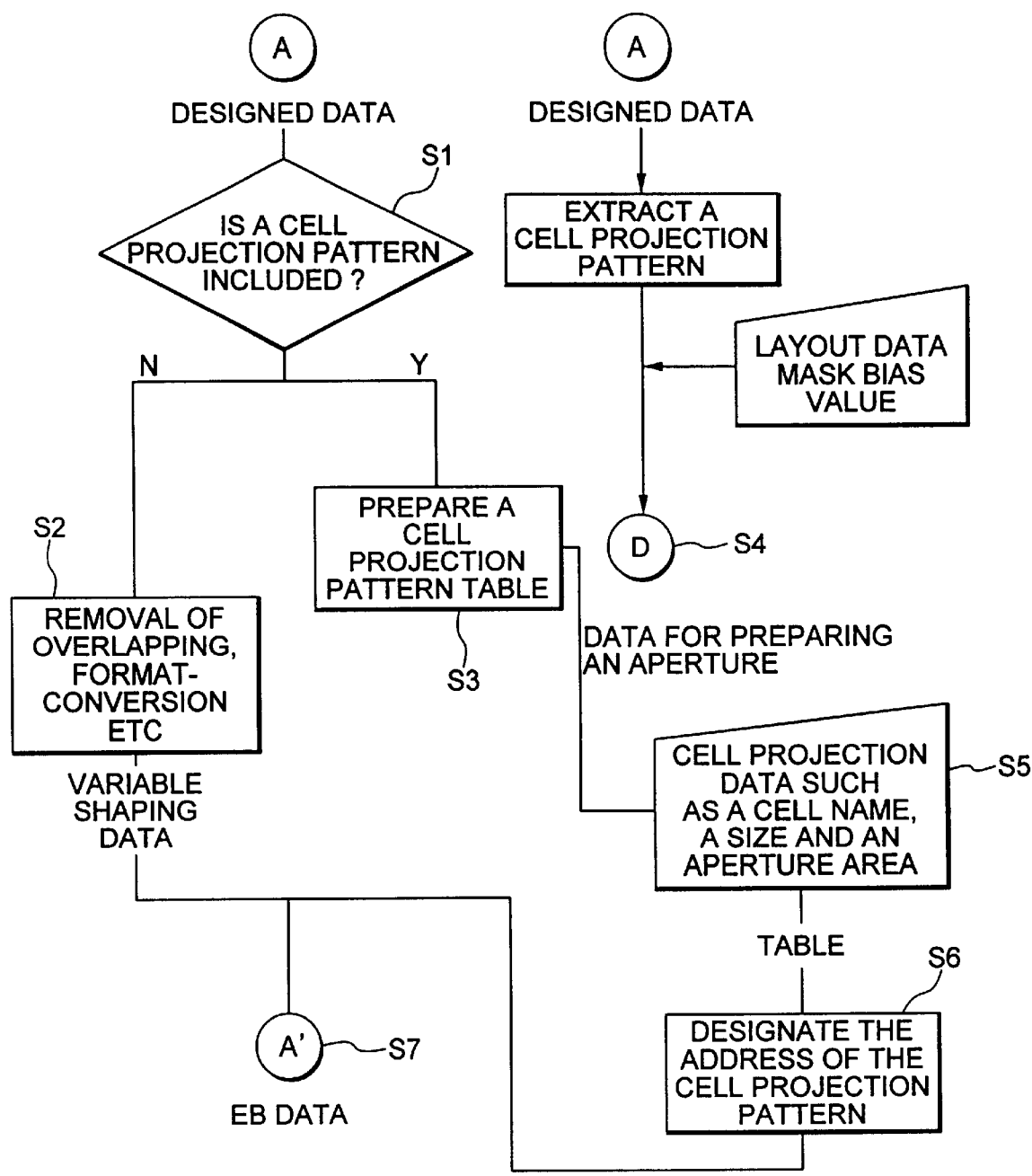
FIG. 2 is a flowchart showing a process for converting data in the prior art.
Figure 3:
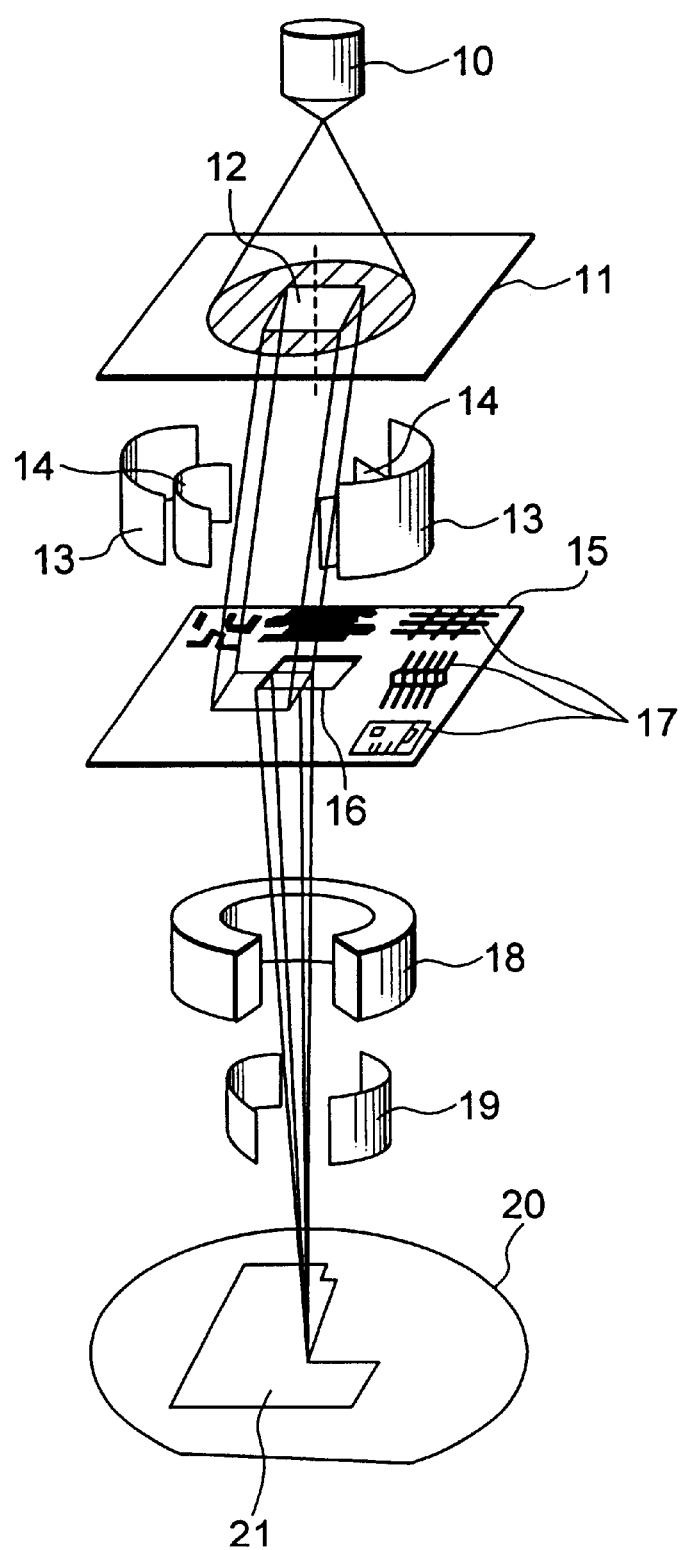
FIG. 3 is a schematic view illustrating an EB exposure device according to an embodiment of the present invention.

Referring to the attached renderings, the present invention will be specifically described by way of embodiments thereof. FIG. 3 is a schematic view illustrating an electron beam exposure device. An electron gun 10 emits an electron beam downward. On the optical axis of this electron beam, there are downward arranged an EB mask 11 as a first aperture member, a shaping deflector 14 and a selection deflector 13, an EB mask 15 as a second aperture member, an objective lens 18, and a positioning deflector 19 in this order. A wafer 20 is arranged below these members. A rectangle aperture 12 is formed in the central portion of the EB mask 11. The EB mask 11 causes the electron beam from the electron gun 10 to be temporarily focused into a rectangle form. The electron beam which has passed through the EB mask 11 is shaped through the shaping deflector 14. The beam position on the EB mask 15 below the selection deflector 13 is controlled by the selection deflector 13. A rectangle and variable shaping aperture 16 is formed in the central portion of the EB mask 15. Plural cell projection apertures 17 are formed around this variable shaping aperture 16. The electron beam which has passed through the EB mask 15 is focused through the objective lens 18 arranged below the EB mask 15. The beam-irradiation position on the wafer 20 is controlled by the positioning deflector 19.

In this exposure device, the size of the electron beam is defined by EB mask 11 and EB mask 15. Namely, the size and the shape of the electron beam which pass through the EB mask 15 is defined by an overlapping area of an area on the EB mask 15 where the electron beam shaped through the aperture 12 of the EB mask 11 is irradiated and the variable shaping aperture 16 of the EB mask 15. The electron beam is focused and radiated onto the wafer 20. In the case that the electron beam which has passed through the EB mask 11 is radiated onto a cell projection aperture 17 of the EB mask 15, the electron beam is shaped into the shape of this cell projection aperture 17. The shaped electron beam is focused and radiated onto the wafer 20. In this way, an irradiation pattern 21 of the electron beam is formed on the wafer 20.

Figure 4:
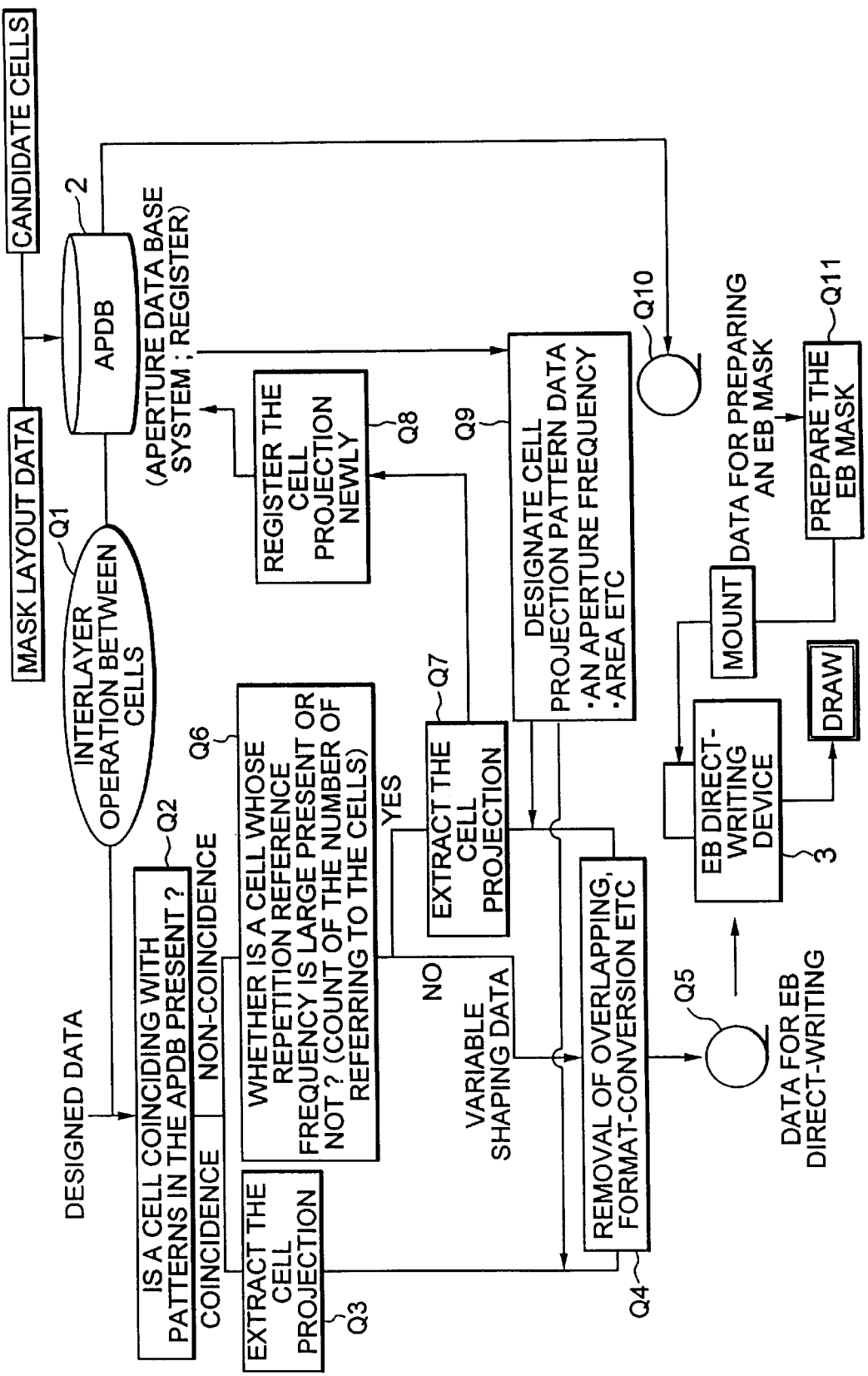
FIG. 4 is a flowchart showing a process for preparing EB data according to the present embodiment.

FIG. 4 is a flowchart showing a process for preparing EB data in this exposure device. Designed data are converted to EB data (writing data) in the step shown in FIG. 4. A register 2 stores an aperture data base system (APDB). This register 2 stores not only cell projections extracted from the designed data, which are objects to be converted, but also patterns for cell projection apertures which are extracted from other designed data or a macro group of existing patterns (i.e., candidate cells). The register 2 also stores data necessary for direct-writing in a cell projection (i.e., mask layout data, such as their cell size, aperture area and gravity), calculated from the these candidate cells, together with data on the shapes of the patters.

Figure 5:
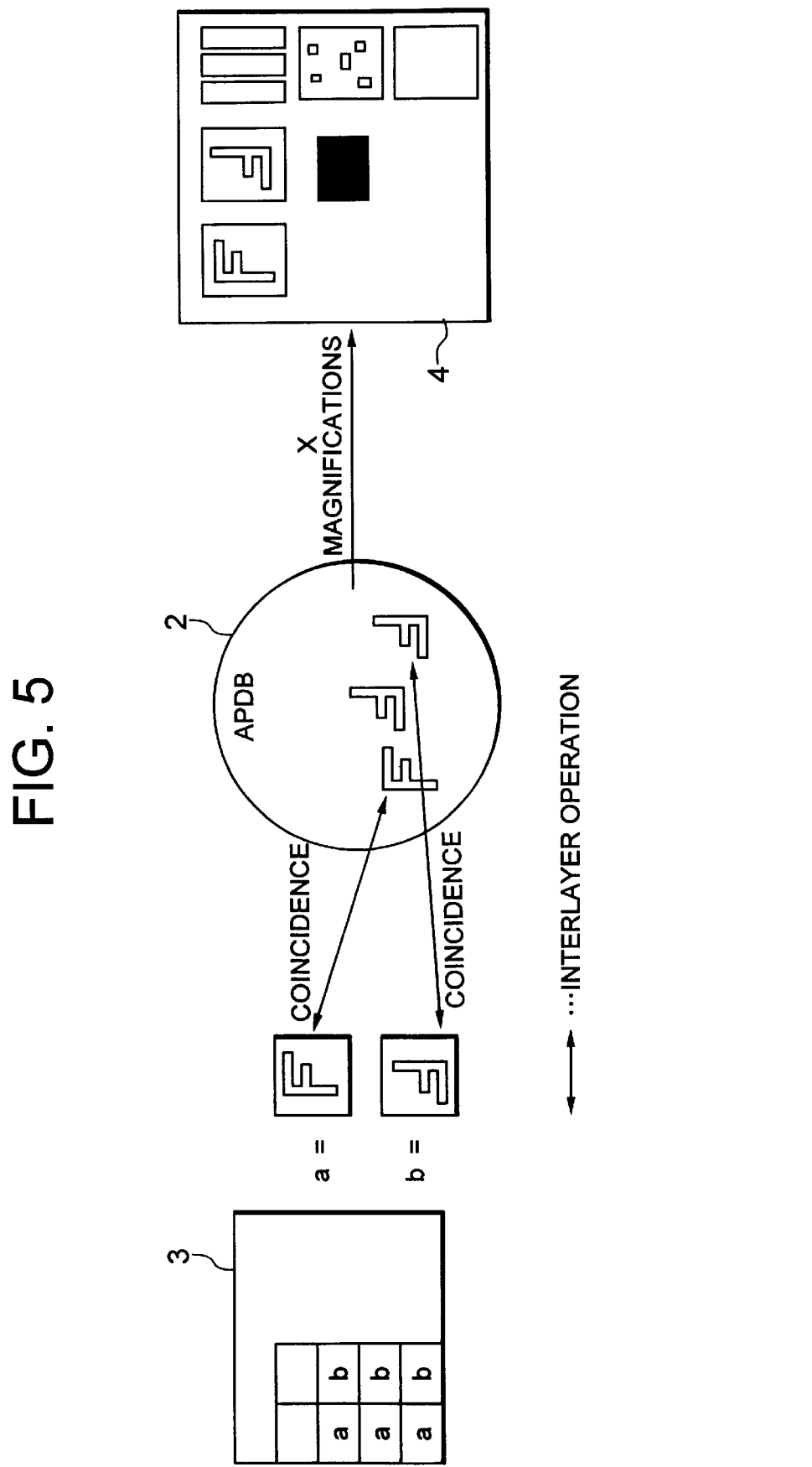
FIG. 5 is a view illustrating designed data, storing patterns of an APDB, and data for preparing an EB mask.

FIG. 5 is a schematic view illustrating designed data 3, the register 2 and data for preparing an EB mask. In the designed data 3, cell projections are specified, together with their irradiation position, by cell names such as cell names a and b. The APDB register 2 stores cell projections having at least some parts of these names, and other cell projections. The designed data 3 are converted to the data 4 for preparing an EB mask, using the APDB stored in the register 2. The cell names a and b correspond to an "F"-shaped cell and an upside-down "F"-shaped cell, respectively.

Referring to FIG. 4, the following will describe a process for converting the designed data to prepare the EB data. An interlayer operation is carried out between the designed data and the APDB stored in the register 2 (step Q1), to judge whether or not the designed data include cell projections which coincide with the patterns in the APDB (step Q2).

This interlayer operation is an operation of comparing the shapes of the cell projections in the designed data 3 with the shapes of the respective cell projections in the APDB 2 to judge whether or not there is a coinciding cell. Specifically, the shape of the respective cell projections is divided into a lattice form, and then each of the lattice squares is expressed by "1" or "0", in accordance with the criterion as to whether a hole is made in the lattice square or not. A subtraction operation is carried out between the numerically-expressed patterns of the designed data and the respective numerically-expressed patterns of the APDB. When the result of the operation is 0, it is judged that a certain cell in the designed data coincides with a certain cell in the APDB. When the result of the operation is not 0, it is judged that no cell in the designed data coincides with any cell in the APDB.

Next, in the case that the judgement of coincidence is given in the step Q2, the cell projection related thereto is extracted (step Q3).

On the other hand, in the case that the judgement of non-coincidence is given in the step Q2, the number of referring to the cell projections in the register 2 is counted about the cells in the designed data. When about a certain cell the reference frequency is over a given value, this cell is understood as a cell whose repetition reference frequency is large (step Q6). When the cell whose reference frequency is large is generated, this cell is extracted as a new cell projection(step Q7). This cell projection is newly registered in the register 2 (step Q8).

In the case that the cell projection is extracted in the step Q3 or Q7, cell projection pattern data such as its aperture number, aperture area, cell size and gravity are designated through the register 2. The cell projection pattern data are added to the data on the extracted cell projection (step Q9).

These cell projection data showing a shape and the cell projection pattern data such as the aperture number are subjected to removal of overlapping and format-conversion (step Q4), so as to output data for EB direct-writing (step Q5). The data for EB direct-writing are supplied to the EB direct-writing device 3 (see FIG. 3).

However, in the case that a cell whose repetition reference frequency is larger than the give value is not present, the designed data are grasped as variable shaping data and then subjected to removal of overlapping and format-conversion (step Q4). They are outputted as data for EB direct-writing (step Q5). In this way, the variable shaping aperture 16 of the EB mask 15 is used.

On the other hand, various kinds of mask layouts for the EB direct-writing device are designated in the register 2. If necessary, mask bias values are inputted thereto. In this way, data for preparing an EB mask are also outputted from the register 2 storing the APDB (step Q10). An EB mask is prepared on the basis of the EB mask preparing data (step Q11). This EB mask is mounted in the EB direct-writing device 3.

As described above, in the present embodiment, the cell projections of the designed data are compared with the respective cell projections of the APDB stored in the register 2 by an interlayer operation. In the case that a coinciding cell projection is present, this cell projection is extracted. Data on the aperture number of the cell projection, the area thereof, and the like are designated and outputted as data for EB direct-writing. These are subjected to operation-treatment in a computer. Therefore, the designation of the cell projections is made automatic to improve the efficiency of data-conversion. Additionally, it is possible to prevent incorrect designation of the cell projections based on artificial input-mistake. In the case that the cell projection present in the designated data is not present in the register 2, data for EB direct-writing are outputted as variable shaping data.

Figure 6:
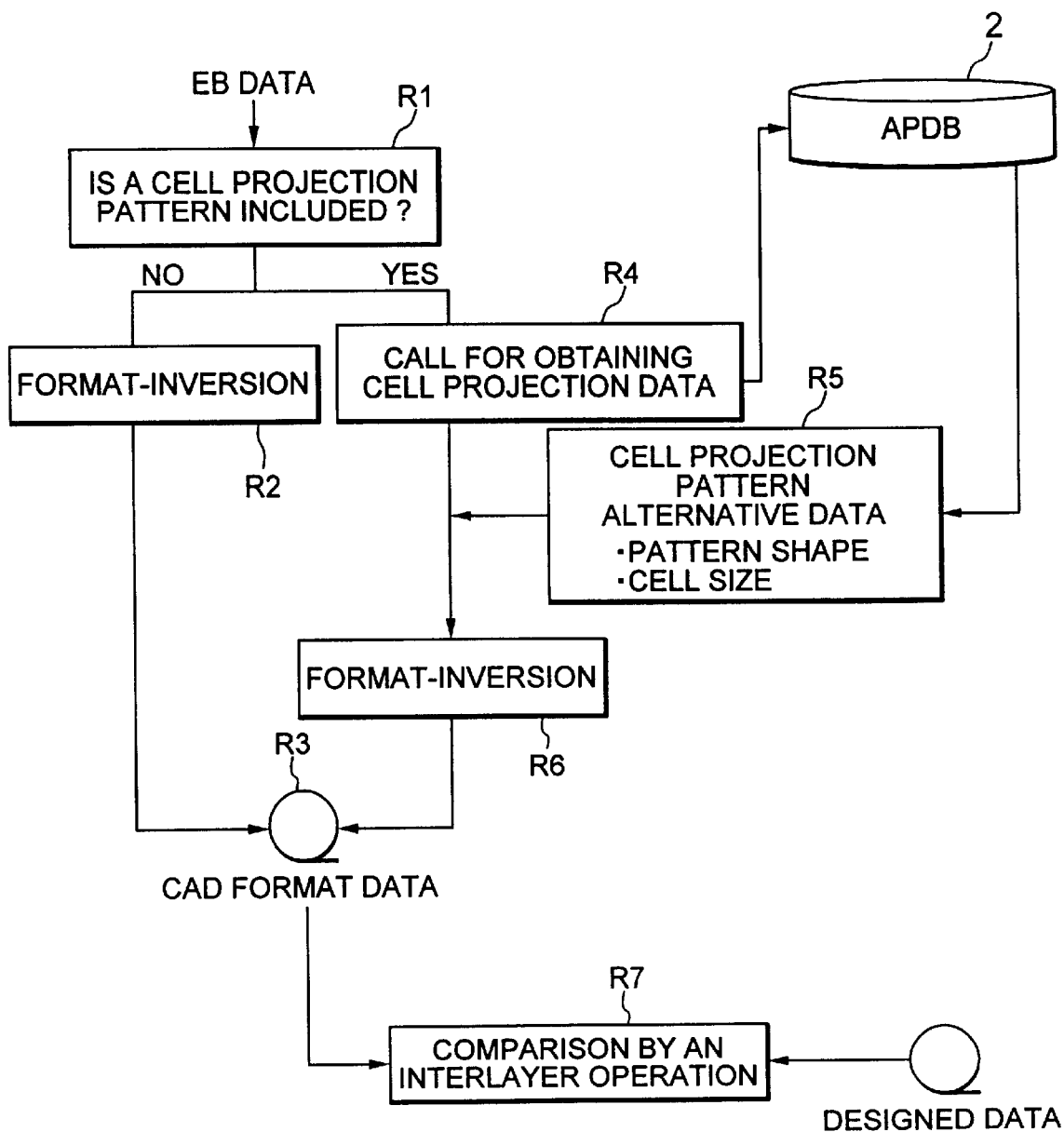
FIG. 6 is a flowchart showing a process for verifying the EB data according to the present embodiment.

The following will describe a process for verifying the EB data according to the present embodiment. It is necessary to invert the EB data obtained as above, subject the inverted data to an interlayer operation to inspect whether or not the inverted data coincide with the designed data. FIG. 6 is a flowchart showing this process for verifying the EB data. Concerning the EB data outputted as data for direct-writing in a cell projection (step Q5), their cell projection pattern portion is represented by data on the array where the cell projection is arranged (an arrangement position, a pitch and an arrangement number), and does not have data on the pattern itself. In the present embodiment, therefore, verification of the EB data by inversion or the like is performed by referring to various data on the cell projection patterns stored in the APDB.

That is, as shown in FIG. 6, it is judged whether or not the EB data include a cell projection pattern (step R1). In the case that the EB data do not include any cell projection pattern, the EB data are inverted (step R2) to obtain CAD format data (step R3). On the other hand, in the case that the EB data include an cell projection pattern, a call for obtaining cell projection data is outputted to the register 2 storing the APDB (step R4). In this ways cell projection pattern alternative data, such as a pattern size and a cell size, are obtained from the register 2 (step R5). The data are added to the cell projection pattern of the EB data. Thereafter, the data including these alternative data are subjected to format-inversion (step R6) to obtain CAD format data (step R3).

The resultant CAD format data are compared with the designed data by an interlayer operation to judge the coincidence or non-coincidence thereof (step R7).

As described above, according to the present embodiment, the EB data can easily be inspected in a computer. As a result, the time for the verification can be remarkably shortened and the precision of the verification can be sufficiently raised.

In the case that the EB data include no cell projection pattern, it is allowable in this process for verifying the EB data that the EB data and the designed data are subjected to format-inversion, not through the register, and an interlayer operation is carried out for comparison.

The following will describe a process for displaying the EB data. Graphic display of the pattern based on the EB data is also performed by referring to various data on the cell projection patterns stored in the APDB register 7.

Figure 7:
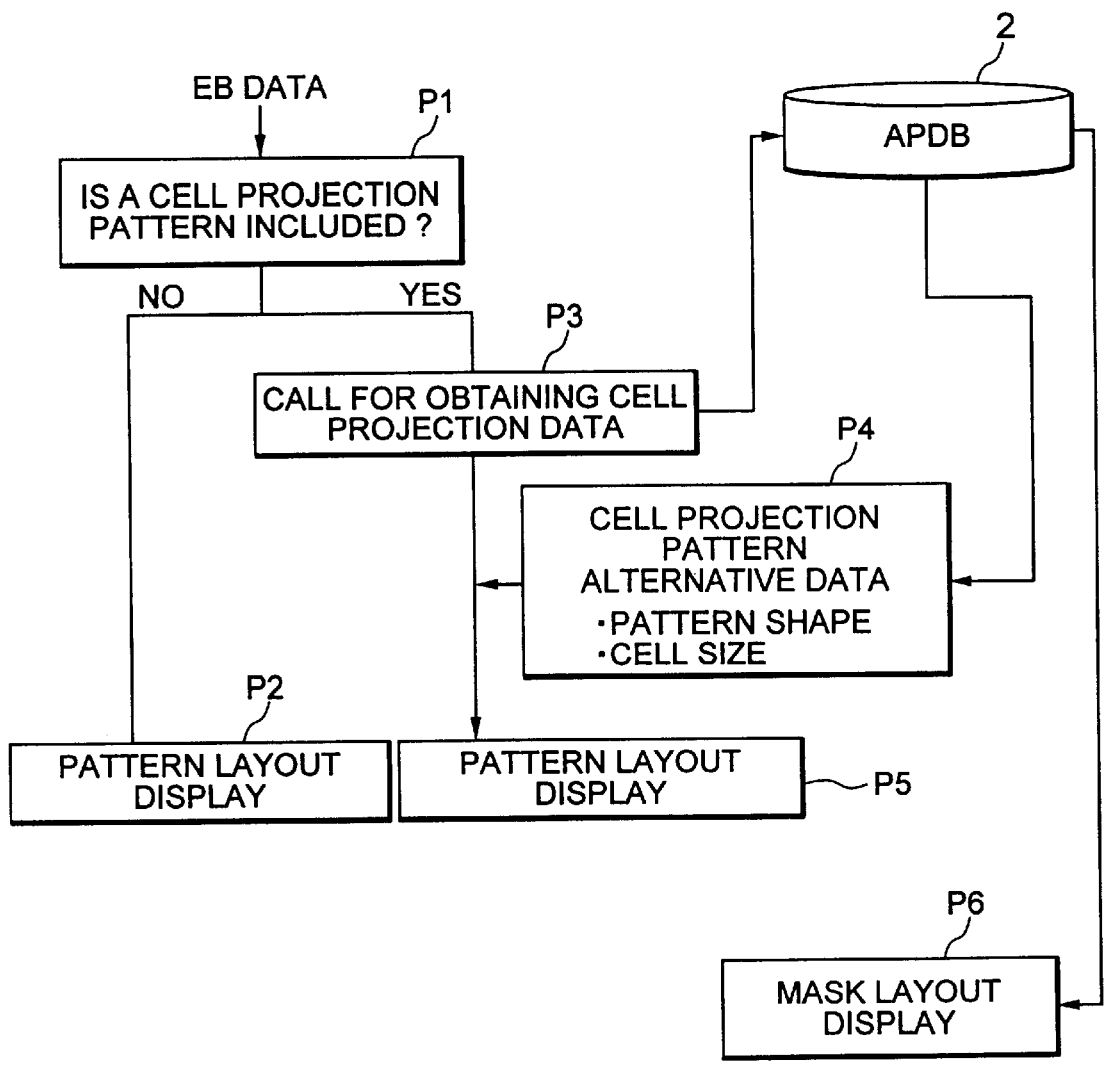
FIG. 7 is a flowchart showing a process for displaying the EB data according to the present embodiment.

FIG. 7 is a flowchart showing a process for displaying the EB data. It is first judged whether or not the EB data include an cell projection pattern (step P1). In the case that the EB data include no cell projection pattern, the EB data per se are displayed as a pattern layout(step P2). In the case that the EB data include a cell projection pattern, a call for obtaining cell projection data is supplied to the register 2 (step P3). The register 2 outputs cell projection pattern alternative data such as a pattern shape and a cell size, and then adds these data to the EB data (step P4). The EB data to which the pattern shape, the cell size and the like are added are displayed as a pattern layout(step P5). The register 2 also outputs a mask layout and displays it (step P6).

Figure 8A:
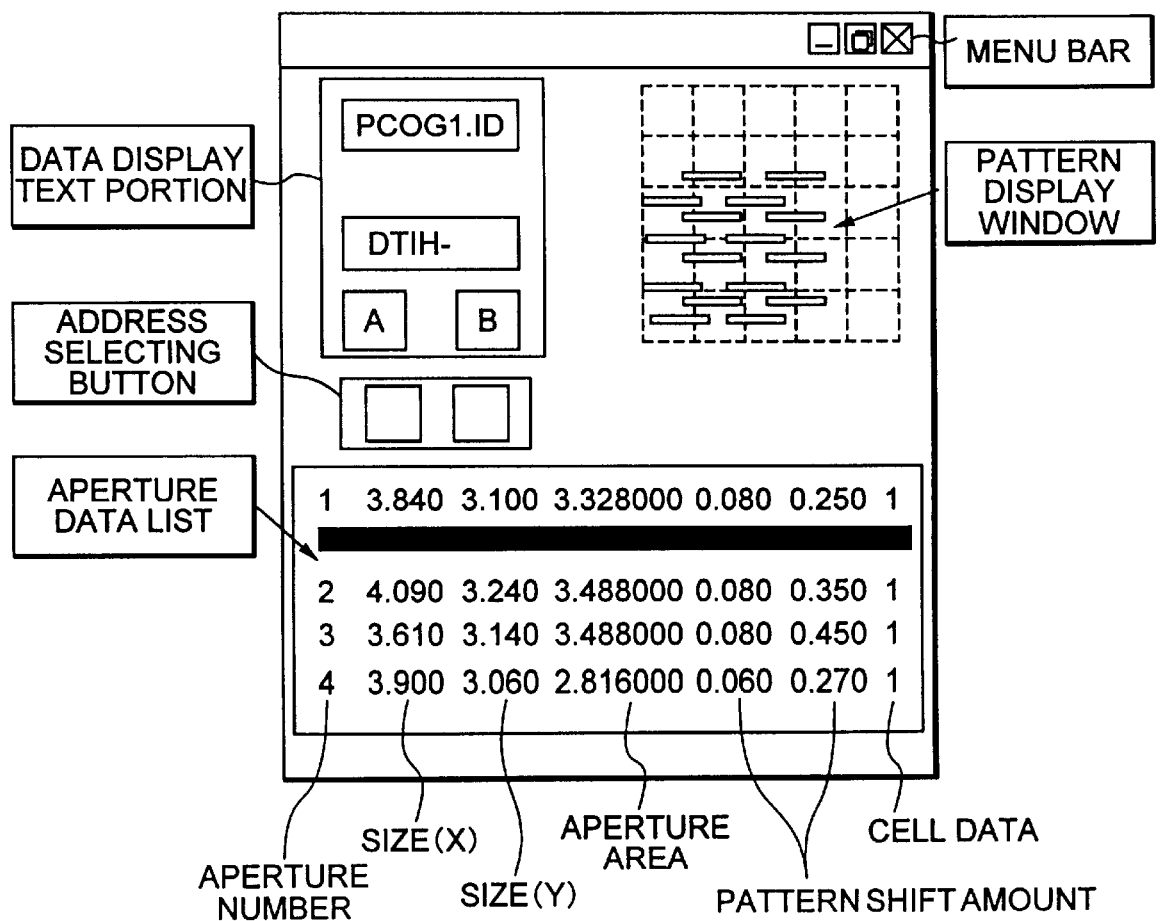
FIG. 8A is a display example of a mask layout pattern.
Figure 8B:
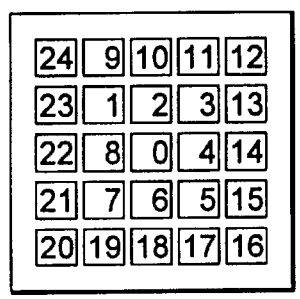
FIG. 8B is a view illustrating the relationship between a mask and an aperture position.

FIG. 8A shows a display example of a mask layout including a pattern display. In FIG. 8A, as aperture numbers, corresponding numbers in a mask shown in FIG. 8B are shown. At the positions shown by the respective numbers, respective cell projections shown by the respective aperture numbers are arranged.

In the case that the EB data include a cell projection pattern in the above-mentioned process for displaying the EB data, data such as a pattern shape and a cell size are supplemented from the register 2 storing the APDB and subsequently the pattern is displayed. Simultaneously, the mask layout about the aperture number and the like is also displayed. Therefore, this pattern can be graphically checked with naked eyes. Thus, a pattern to be drawn can easily be checked.

The present invention is not limited to the above-mentioned embodiment. Various modifications may be made within the scope of the present invention. For example, in the interlayer operation of the above-mentioned embodiment, it is judged whether or not cell projections of the designated data coincide with the cell projections of the APDB stored in the register 2 by subtraction operation. In the present invention, however, such a judgement may be made by various logical operations.

As described, according to the present invention, at the time of preparing, verifying and displaying EB data, patterns of cell projections are stored in a register. These are compared in a computer to prepare, inspect and display the EB data. Therefore, the designation of the cell projections is automatically performed to improve the efficiency of data conversion remarkably. Additionally, it is possible to prevent incorrect designation of data based on artificial mistakes. Thus, safety is improved.

What is claimed is:

1. A process for preparing data for direct-writing by a charged particle beam, comprising:

storing plural patterns of cell projections made in an aperture in a register, and comparing cells in designed data with the cell projections stored in the register by an interlayer operation;

judging whether a cell which coincides with any one of the cells in the designed data is present among the patterns of the cell projections stored in the register from the results of the interlayer operation;

extracting the coinciding cell projection as an extracted cell projection, in the case that the judging that the coinciding cell is present; and outputting the extracted cell projection as data for direct-writing.

2. The process according to claim 1, which further comprises outputting mask data for preparing a mask having the pattern of the cell projection stored in the register.

3. The process according to claim 1, further comprising registering a cell as a new cell projection if the cell has a reference frequency over a given value.

4. A process for preparing data for direct-writing by a charged particle beam, comprising:

storing plural patterns of cell projections made in an aperture in a register, and comparing cells in designed data with the cell projections stored in the register by an interlayer operation;

judging whether a cell which coincides with any one of the cells in the designed data is present among the patterns of the cell projections stored in the register from the results of the interlayer operation;

extracting the coinciding cell projection as an extracted cell projection, in the case that the judging that the coinciding cell is present; and outputting the extracted cell projection as data for direct-writing, wherein in the case that the judgement that no coinciding cell is present is given, second judging whether a cell whose reference frequency is over a given value is present in the designed data, when referring the cells in the designed data to the cell projections stored in the register, second extracting this cell, in the case that the cell whose reference frequency is over the given value is present in the designed data, and registering this cell as a new cell projection.

5. The process according to claim 4, which, after extracting and the second extracting, comprises reading out cell projection pattern data, which include an aperture number and an aperture area, from the register, and designating the data.

6. The process according to claim 4, further comprising outputting mask data for preparing a mask having the patterns of the cell projections stored in the register.

7. A process for verifying data for direct-writing by a charged particle beam, comprising the steps of:

storing plural patterns of cell projections made in an aperture in a register, and judging whether or not writing data include a cell projection pattern, first format-inverting the writing data to obtain format data, in the case that the writing data include no cell projection pattern;

second format-inverting an alternative data to obtain format data by outputting a call for obtaining cell projection data to the register so as to obtain said alternative data of cell projection pattern from the register, in the case that the writing data include the cell projection pattern; and comparing these format data resulting from the format-inversion with designed data by an interlayer operation.

8. The process according to claim 7, further comprising registering a cell as a new cell projection if the cell has a reference frequency over a given value.

9. A process for displaying data for direct-writing by a charged particle beam, comprising the steps of:

storing plural patterns of cell projections made in an aperture in a register, and judging whether or not writing data include a cell projection pattern;

first displaying the writing data as a pattern layout, in the case that the writing data include no cell projection pattern;

second displaying an alternative data as a pattern layout by outputting a call for obtaining cell projection data to the register so as to obtain said alternative data of the cell projection pattern from the register, in the case that the writing data include the cell projection pattern.

10. The process according to claim 9, further comprising inputting the call for obtaining the cell projection data so as to obtain a mask layout from the register, and displaying this mask layout.

11. An exposure device, comprising:
a source for radiating a charged particle ray;
a mask having a cell projection aperture;
a unit for focusing the charged particle ray;
a first deflector for deciding a position on the mask irradiated with the charged particle ray;
a second deflector for deciding a position on a wafer irradiated with the charged particle ray;
a controlling unit for controlling irradiation of the wafer with the charged particle ray and the cell projection aperture in connection with each other; and
a register in which patterns of cell projections are stored,
wherein said controlling unit compares a cell projection of designed data with the cell projections in the register by an interlayer operation and then extracts, in the case that both of them coincide with each other, the coinciding cell projection from the register to use this coinciding cell projection, together with pattern data including an aperture position in the mask and an aperture area, as writing data.

12. The exposure device according to claim 11, wherein the controlling unit is configured to register a cell as a new cell projection if the cell has a reference frequency over a given value.

13. An exposure device, comprising:
a source for radiating a charged particle ray;
a mask having a cell projection aperture;
a unit for focusing the charged particle ray;
a first deflector for deciding a position on the mask irradiated with the charged particle ray;
a second deflector for deciding a position on a wafer irradiated with the charged particle ray;
a controlling unit for controlling irradiation of the wafer with the charged particle ray and the cell projection aperture in connection with each other; and
a register in which patterns of cell projections are stored,
wherein said controlling unit compares a cell projection of designed data with the cell projections in the register by an interlayer operation and then extracts, in the case that both of them coincide with each other, the coinciding cell projection from the register to use this coinciding cell projection, together with pattern data including an aperture position in the mask and an aperture area, as writing data, and
wherein in the case that the cell projection of the designed data does not coincide with the cell projections stored in the register by the interlayer operation, the controlling unit extracts a cell projection about which the repetition reference frequency of the register is over a given number, and registers the cell projection newly.

* * * * *